US012725675B2

(12) United States Patent
Uribe

(10) Patent No.: US 12,725,675 B2
(45) Date of Patent: Sep. 1, 2026

(54) READ COMMAND FAULT DETECTION IN A MEMORY SYSTEM

(71) Applicant: Micron Technology, Inc., Boise, ID (US)

(72) Inventor: Melissa I. Uribe, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 18/423,059

(22) Filed: Jan. 25, 2024

(65) Prior Publication Data

US 2024/0161854 A1 May 16, 2024

Related U.S. Application Data

(62) Division of application No. 17/646,264, filed on Dec. 28, 2021, now Pat. No. 11,923,027.

(51) Int. Cl.

| | |
|---|---|
| ***G11C 29/42*** | (2006.01) |
| ***G11C 7/10*** | (2006.01) |
| ***G11C 29/44*** | (2006.01) |

(52) U.S. Cl.

CPC ............ *G11C 29/42* (2013.01); *G11C 7/1039* (2013.01); *G11C 7/1069* (2013.01); *G11C 7/1096* (2013.01); *G11C 29/4401* (2013.01)

(58) Field of Classification Search

CPC ..... G11C 29/42; G11C 7/1039; G11C 7/1069; G11C 7/1096; G11C 29/4401

See application file for complete search history.

(56) References Cited

U.S. PATENT DOCUMENTS

| | | | | |
|---|---|---|---|---|
| 6,374,377 | B1 | 4/2002 | Guddat et al. | |
| 7,535,901 | B2 * | 5/2009 | Hasegawa | H04L 45/00 370/252 |
| 9,563,368 | B2 * | 2/2017 | Shin | G06F 3/0611 |
| 10,671,464 | B2 * | 6/2020 | Oh | G11C 16/10 |
| 10,776,047 | B2 * | 9/2020 | Sun | G06F 3/0659 |
| 2017/0185499 | A1 | 6/2017 | Lee et al. | |
| 2018/0336139 | A1 | 11/2018 | Rao et al. | |
| 2020/0210296 | A1 | 7/2020 | Kang et al. | |
| 2023/0053384 | A1 | 2/2023 | Uribe | |
| 2023/0170008 | A1 | 6/2023 | Zhang et al. | |

* cited by examiner

*Primary Examiner* — Vanthu T Nguyen

(74) *Attorney, Agent, or Firm* — Holland & Hart LLP

(57) ABSTRACT

Methods, systems, and devices for read command fault detection in a memory system are described. For example, a memory device may be configured to set a field of a register with a first value, corresponding to a state where a read command has not been decoded. If the memory device receives and decodes a read command from a host device, the memory device may set the field with a second value. The memory device indicate a value of the field of the register to the host device, which may be used to evaluate whether to process information interpreted over an interface between the host device and the memory device. For example, if the host device receives an indication of the second value, the host device may proceed with processing and, if the host device receives an indication of the first value, the host device may refrain from processing.

20 Claims, 8 Drawing Sheets

350

READ COMMAND FAULT DETECTION IN A MEMORY SYSTEM

CROSS REFERENCE

The present application for patent is a divisional of U.S. patent application Ser. No. 17/646,264 by Uribe, entitled "READ COMMAND FAULT DETECTION IN A MEMORY SYSTEM," filed Dec. 28, 2021, assigned to the assignee hereof, and is expressly incorporated by reference in its entirety herein.

FIELD OF TECHNOLOGY

The following relates to one or more systems for memory, including read command fault detection in a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
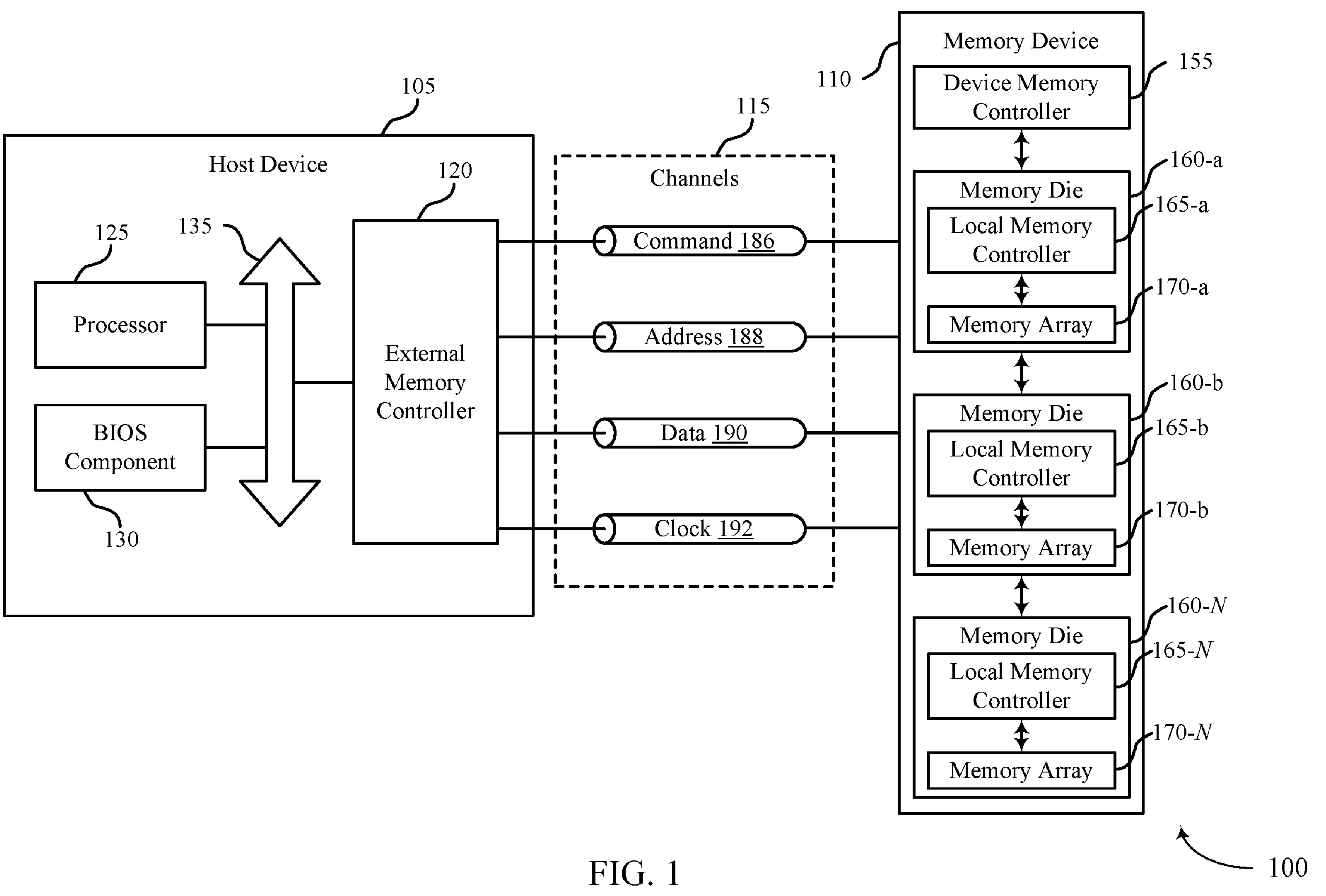
FIG. 1 illustrates an example of a system that supports read command fault detection in accordance with examples as disclosed herein.

A memory system in accordance with examples disclosed herein may include a memory device and a host device coupled with the memory device. A reliability of a memory device in such a system may be based on a statistical probability of failures at the memory device, which may be referred to as a failure in time (FIT), or other terminology. Some applications, such as vehicle safety systems, autonomous vehicle systems, advanced driver assistance systems (ADAS), or other safety-critical systems may have particularly high reliability requirements, or may otherwise be expected to operate with a particularly low probability of unresolved, undetected, or otherwise unhandled failures.

Memory systems may implement various communication interface architectures between a host device and a memory device. For example, a memory system may implement a serial peripheral interface (SPI), among other examples of a full duplex interface or synchronous serial communication interface, between a first device (e.g., a master device, a host device) and a second device (e.g., a secondary device, a dependent device, a memory device). Such an interface may convey command signaling from a host device to a memory device, or convey information signaling (e.g., write information, read information) between the host device and the memory device, among other signaling. In some examples, however, a host device or a memory device may not properly decode or otherwise interpret signaling that is conveyed across such an interface. For example, faults in a command decoder, clock signals, or control signals, among other faults, may result in a memory device not decoding or otherwise not recognizing a read command from a host device. Thus, the memory device may not drive an output of an interface with a host device after a read command is transmitted by the host device (e.g., because the memory device may not recognize that a host device was trying to access the memory device).

In some examples, an architecture of an interface implemented between a host device and a memory device may affect an ability to detect faults across the interface. For example, one or more outputs of a device (e.g., the host device, the memory device) that communicates over an interface, such as an SPI, may not be terminated (e.g., may be associated with a high impedance or "high-Z" output), such that invalid signaling may not be detectable by checking for all-1s or all-0s, among other techniques. Moreover, in some examples, a transmitting device (e.g., a memory device) may be configured with its own (e.g., internal) error detection or error correction functionality (e.g., error correction code (ECC) functionality), such that a receiving device (e.g., a host device) may be configured to accept information that the receiving device interprets over the interface without additional checks (e.g., without using an error detection or error correction functionality of the receiving device, without receiving parity bits from the transmitting device) that might otherwise detect erroneous data, or scenarios where the transmitting device is not driving an output coupled with or otherwise associated with the interface. Thus, some implementations of the SPI or other synchronous serial communication interface may be associated with implementation challenges for safety-critical systems that rely on a low probability of unresolved, undetected, or otherwise unhandled failures.

In accordance with examples as disclosed herein, a memory system may implement logical signaling, such as signaling of a register value or other status value, to indicate whether a memory device has decoded a read command transmitted by a host device. For example, a memory device may be configured to set a field of a register with a first value, which may correspond to a state where a read command has not been decoded. If the memory device receives and decodes a read command, the memory device may set the field of the register with a different value (e.g., a second value), which may correspond to a state where a read command has been decoded. In various examples, the memory device may transmit an indication of the current value of the field of the register to a host device, which the host device may use to evaluate whether to process information interpreted over an interface between the host device and the memory device. For example, if the host device receives an indication of the second value (e.g., indicative of the memory device having decoded a read command), the host device may proceed with processing information received over the interface and, if the host device receives an indication of the first value (e.g., indicative of the memory device having not decoded a read command), the host device may refrain from processing information received over the interface (e.g., because the memory device may not be driving its output on the interface) and, alternatively, may proceed with various error handling operations. Accordingly, by signaling a value indicative of whether a memory device has decoded a read command, such techniques may support a host device evaluating whether to process information interpreted from the interface as valid data, or to refrain from processing data that may be invalid (e.g., detecting a fault in real time based on the signaled value), which may improve reliability of the memory system (e.g., by preventing a host device from erroneously processing information interpreted from an interface with a memory device).

Features of the disclosure are initially described in the context of systems and devices as described with reference to FIGS. 1 and 2. Features of the disclosure are described in the context of process flows and related signaling with reference to FIGS. 3A and 3B. These and other features of the disclosure are further illustrated by and described with reference to an apparatus diagram and flowcharts that relate to read command fault detection in a memory system as described with reference to FIGS. 4-7.

FIG. 1 illustrates an example of a system 100 (e.g., a memory system) that supports read command fault detection in accordance with examples as disclosed herein. The system 100 may include a host device 105, a memory device 110, and an interface 115 (e.g., one or more channels, one or more signal paths) coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 (e.g., over the interface 115) may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120 (e.g., a controller or processor coupled with the interface 115), a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package. The memory arrays 170 may be configured with memory cells in accordance with one or more architectures, such as DRAM memory cells, FeRAM memory cells, SDRAM memory cells, SRAM memory cells, MRAM memory cells, PCM memory cells, or NAND memory cells, among architectures or combinations thereof. In some examples, the memory device 110 may include one or more memory dies 160 configured with NAND memory cells, which may include the memory device 110 being configured as a standalone NAND device, or a managed NAND device, among other configurations.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105 (e.g., at the device memory controller 155, over the interface 115). For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120 over the interface 115), transmitters for transmitting signals (e.g., to the external memory controller 120 over the interface 115), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels of the interface 115. Channels of the interface 115 may be operable to support communications between the external memory controller 120 and the memory device 110. Each channel may be an example of a transmission medium that carries information between the host device 105 and the memory device. Each channel may be associated with one or more signal paths (e.g., conductors) between terminals associated with the components of the system 100. A signal path may be an example of a conductive path or another type of path operable to carry a signal. For example, the interface 115 may be associated with a first terminal including one or more pins or pads at the host device 105 and one or more pins or pads at the memory device 110. A pin may be an example of a conductive input or output point of a device of the system 100, and a pin may be operable to act as part of the interface 115. Channels of the interface 115 may be associated with any quantity of signal paths (including a single signal path). In some examples, a channel may include multiple individual signal paths. For example, a channel may be ×4 (e.g., including four signal paths), ×8 (e.g., including eight signal paths), ×16 (including sixteen signal paths), etc.

In some examples, channels of the interface 115 (and associated signal paths and terminals) may be dedicated to communicating one or more types of information. For example, the interface 115 may include one or more command channels 186, one or more address channels 188, one or more data channels 190, or one or more clock channels 192, among other channels or combinations of channels. In various examples, a channel of the interface 115 may be associated with one or more signal paths that are dedicated to the channel, or multiple channels may share a set of one or more signal paths (e.g., may be associated with signaling that is multiplexed or modulated on shared signal paths). For example, aspects of command channel 186 and an address channel 188 may be combined in a command address (CA) channel architecture, or a command channel 186, an address channel 188, and a data channel 190 may be combined in another common channel architecture (e.g., a DQ channel, a DQ bus), among other examples. In some examples, signaling may be communicated over the interface 115 using single data rate (SDR) signaling or double data rate (DDR) signaling. In SDR signaling, one modulation symbol (e.g., signal level) of a signal may be registered for each clock cycle (e.g., on a rising or falling edge of a clock signal carried on a clock channel 192). In DDR signaling, two modulation symbols (e.g., signal levels) of a signal may be registered for each clock cycle (e.g., on both a rising edge and a falling edge of a clock signal).

In some examples, a command channel 186 may be operable to communicate commands between the host device 105 and the memory device 110, including control information associated with the commands, which may be accompanied by address information (e.g., over an address channel 188). For example, commands carried by a command channel 186 may include a read command, which may be associated with an address of the desired data (e.g., conveyed over an address channel 188). In various examples, a data channel 190 may be operable to communicate one or more of data, control information, or address information, between the host device 105 and the memory device 110. For example, a data channel 190 may communicate (e.g., bi-directionally) information to be written to the memory device 110 or information read from the memory device 110. In various examples, information conveyed over the interface 115 may be transmitted or received (e.g., registered) in accordance with rising edges, falling edges, or both rising and falling edges of a clock signal conveyed over a clock channel 192. In some examples, the interface 115 may include one or more error detection code (EDC) channels (not shown). An EDC channel may be operable to communicate error detection signals, such as checksums, to improve system reliability. An EDC channel may include any quantity of signal paths. In some examples, a bus of the interface 115 (e.g., a data bus) may be associated with a quantity of signals paths (e.g., four signal paths, four I/O paths) configured in a full duplex arrangement, which may support one or more of the described channels or associated functionality thereof in accordance with various serialization or multiplexing techniques.

Signals communicated over channels of the interface 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and others.

The interface 115 may be implemented as an SPI, among other examples of a full duplex interface or synchronous serial communication interface, where a transmitting device (e.g., the host device 105 or the memory device 110), or a component thereof (e.g., an external memory controller 120, a device memory controller 155) may be configured to drive an output coupled with a signal path of the interface 115 to perform a transmission (e.g., command signaling, information signaling). In some examples, however, the host device 105 or the memory device 110 may not properly decode or otherwise interpret signaling that is transmitted across the interface 115. For example, faults in a command decoder, clock signals, or control signals, among other faults may result in the memory device 110 not decoding or otherwise not recognizing a read command that was transmitted by the host device 105 over the interface 115. Thus, the memory device 110 (e.g., the device memory controller 155) may not drive an output coupled with the interface 115 after a read command is transmitted by the host device 105 (e.g., because the memory device 110 may not recognize that the host device 105 was trying to access it).

In some examples, an architecture of the interface 115 may affect an ability to detect faults across the interface 115. For example, one or more outputs coupled with the interface 115 (e.g., an output or driver of a device memory controller 155, an output or driver of an external memory controller 120) may not be terminated (e.g., may be associated with a high impedance or "high-Z" output), such that invalid signaling may not be detectable by a receiving device with all-1s or all-0s checks, among other techniques. Moreover, in some examples, a transmitting device (e.g., the memory device 110) may be configured with its own error detection or error correction functionality (e.g., ECC functionality), such that a receiving device (e.g., the host device 105) may be configured to accept information that the receiving device interprets over the interface 115 without additional checks (e.g., without using an error detection or error correction functionality of the receiving device, without receiving parity bits from the transmitting device) that might otherwise detect erroneous data, or scenarios where the transmitting device is not driving an output coupled with the interface 115. Thus, some implementations of the interface 115 may be associated with implementation challenges for safety-critical systems that rely on a low probability of failures.

In accordance with examples as disclosed herein, the system 100 may be configured to implement logical signaling, such as signaling of a register value or other status value, to indicate whether the memory device 110 has decoded a read command transmitted by the host device 105. For example, the memory device 110 may be configured to set a field of a register with a first value, which may correspond to a state where a read command has not been decoded. If the memory device 110 receives and decodes a read command from the host device 105, the memory device 110 may set the field of the register with a different value (e.g., a second value), which may correspond to a state where a read command has been decoded.

The memory device 110 may transmit an indication of the current value of the field of the register to the host device 105 in accordance with various techniques, and the host device 105 may use the value indicated by the memory device 110 to evaluate whether to process information interpreted over the interface 115. For example, if the host device 105 receives an indication of the second value (e.g., indicative of the memory device 110 having decoded a read command), the host device 105 may proceed with processing information received over the interface 115 and, if the host device 105 receives an indication of the first value (e.g., indicative of the memory device 110 having not decoded a read command), the host device 105 may refrain from processing information received over the interface 115 (e.g., because the memory device 110 may not be driving its output on the interface 115) and the host device 105 may instead proceed with various error handling operations. Accordingly, by signaling a value indicative of whether a memory device 110 has decoded a read command, such techniques may support the host device 105 evaluating whether to process information interpreted from the interface 115 as valid data, or to refrain from processing data that may be invalid (e.g., detecting a fault in real time based on the signaled value), which may improve reliability of the system 100 (e.g., by preventing the host device 105 from erroneously processing information interpreted from the interface 115).

Figure 2:
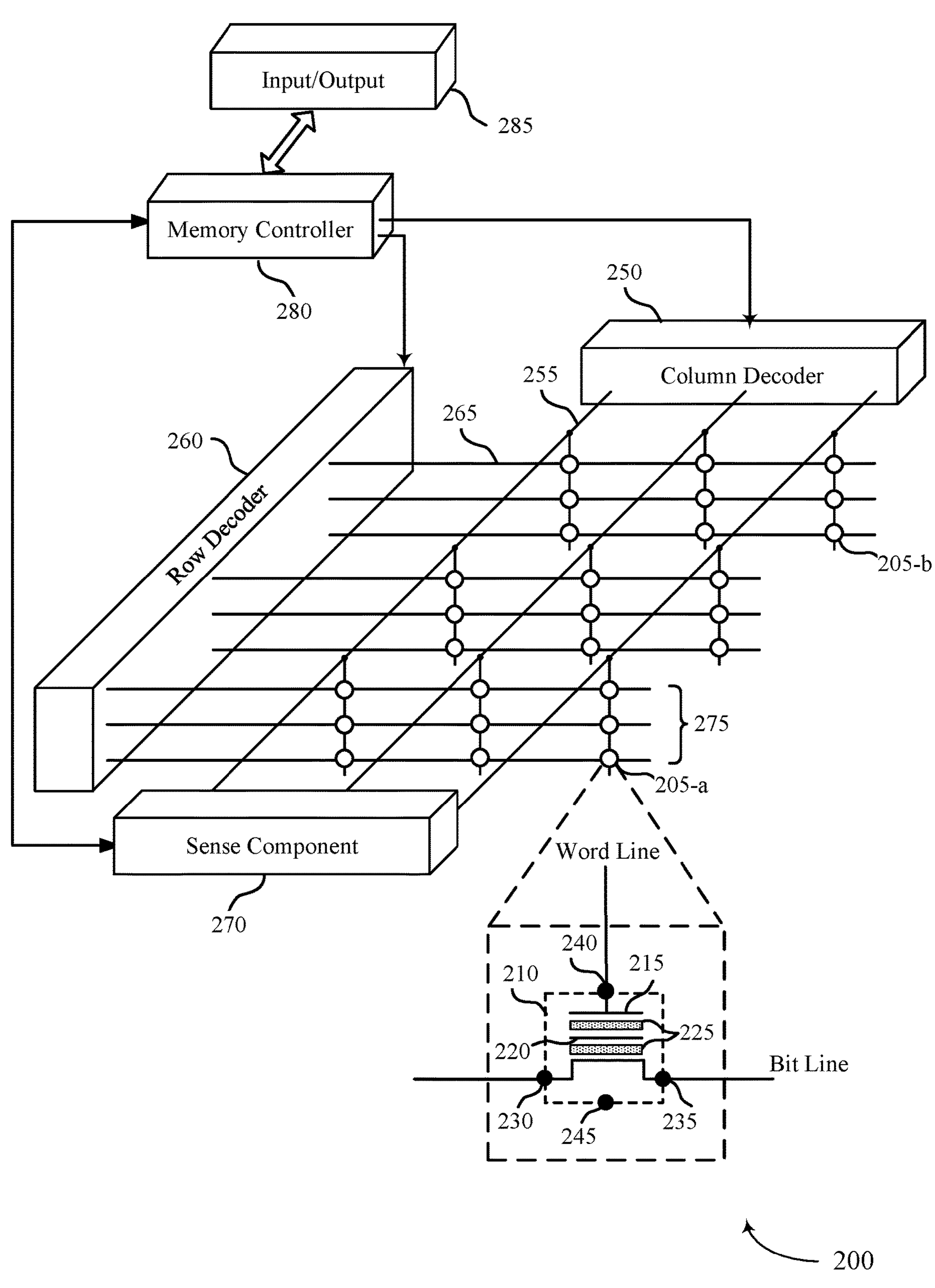
FIG. 2 illustrates an example of a memory device that supports read command fault detection in a memory system in accordance with examples as disclosed herein.

FIG. 2 illustrates an example of a memory device 200 that supports read command fault detection in accordance with examples as disclosed herein. In some cases, the memory device 200 may be an example of a memory device 110, including components of a memory die 160, as described with reference to FIG. 1. FIG. 2 is an illustrative representation of various components and features of the memory device 200. As such, it should be appreciated that the components and features of the memory device 200 are shown to illustrate functional interrelationships, and not necessarily actual physical positions within the memory device 200. Further, although some elements included in FIG. 2 are labeled with a numeric indicator, some other corresponding elements are not labeled, even though they are the same or would be understood to be similar, in an effort to increase visibility and clarity of the depicted features.

The memory device 200 may include one or more memory cells, such as memory cell 205-*a* and memory cell 205-*b*. A memory cell 205 may be, for example, a flash or other type of NAND memory cell, such as in the blow-up diagram of memory cell 205-*a*. In some such examples, the memory device 200 may be an example of a standalone NAND device or a managed NAND device. Each memory cell 205 may be programmed to store a logic value representing one or more bits of information. In some cases, a single memory cell 205—such as a single-level cell (SLC) memory cell 205—may be programmed to one of two supported states and thus may store one bit of information at a time (e.g., a logic 0 or a logic 1). In other cases, a single memory cell 205—such as a multi-level cell (MLC), a tri-level cell (TLC), a quad-level cell (QLC), or other type of multiple-level memory cell 205—may be programmed to one of more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 205 may be programmed to one of sixteen supported states and thus may store four bits of information at a time corresponding to one of sixteen logic values (e.g., 0000, 0001, . . . 1111).

In some cases, a multiple-level memory cell 205 (e.g., an MLC memory cell, a TLC memory cell, a QLC memory cell) may be physically different than an SLC cell. For example, a multiple-level memory cell 205 may use a different cell geometry or may be fabricated using different materials. In some cases, a multiple-level memory cell 205 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

Different types of memory cells 205 may store information in different ways. In a DRAM memory array, for example, each memory cell 205 may include a capacitor that includes a dielectric material (e.g., an insulator) to store a charge representative of a programmable state and thus the stored information. In an FeRAM memory array, as another example, each memory cell 205 may include a capacitor that includes a ferroelectric material to store a charge or a polarization representative of a programmable state and thus the stored information.

In some NAND memory arrays (e.g., flash arrays), each memory cell 205 may include a transistor that has a charge trapping structure (e.g., a floating gate, a replacement gate, or a dielectric material) for storing an amount of charge representative of the logic value. For example, the blow-up in FIG. 2 illustrates a NAND memory cell 205-*a* that includes a transistor 210 (e.g., a metal-oxide-semiconductor (MOS) transistor) that may be used to store a logic value. The transistor 210 has a control gate 215 and may also include a charge trapping structure 220 (e.g., a floating gate or a replacement gate), where the charge trapping structure 220 is sandwiched between two portions of dielectric material 225. The transistor 210 includes a first node 230 (e.g., a source or drain) and a second node 235 (e.g., a drain or source). A logic value may be stored in the transistor 210 by placing (e.g., writing, storing) a quantity of electrons (e.g., an amount of charge) on charge trapping structure 220. The amount of charge to be stored on the charge trapping structure 220 may depend on the logic value to be stored. The charge stored on charge trapping structure 220 may affect the threshold voltage of the transistor 210, thereby affecting the amount of current that flows through the transistor 210 when the transistor 210 is activated (e.g., when a voltage is applied to the control gate 215). In some examples, the charge trapping structure 220 may be an example of a floating gate that may be part of a 3D NAND structure. For example, a 3D NAND may have multiple floating gates arranged around a single channel (e.g., horizontal or vertical channel). Other structures may also be used for a 3D NAND, including the use of replacement gate technology in the place of floating gate.

A logic value stored in a transistor 210 may be sensed (e.g., as part of a read operation) by applying a voltage to the control gate 215 (e.g., to control node 240, via the word line 265) to activate transistor 210 and measuring (e.g., detecting, sensing) the resulting amount of current that flows through the first node 230 or the second node 235 (e.g., via a digit line 255). For example, a sense component 270 may determine whether an SLC memory cell 205 stores a logic 0 or a logic 1 in a binary manner (e.g., based on a presence or absence of a current through the memory cell 205 when a read voltage is applied to the control gate 215, or based on whether the current is above or below a threshold current). For a multiple-level memory cell 205, a sense component 270 may determine a logic value stored in the memory cell 205 based on various intermediate threshold levels of current when a read voltage is applied to the control gate 215. In one example of a multiple-level architecture, a sense component 270 may determine the logic value of a TLC memory cell 205 based on eight different levels of current, or ranges of current, that define the eight potential logic values that could be stored by the TLC memory cell 205.

An SLC memory cell 205 may be written by applying one of two voltages (e.g., a voltage above a threshold or a voltage below a threshold) to memory cell 205 to store, or not store, an electric charge on the charge trapping structure 220 and thereby cause the memory cell 205 store one of two possible logic values. For example, when a first voltage is applied to the control node 240 (e.g., via the word line 265) relative to a bulk node 245 for the transistor 210 (e.g., when the control node 240 is at a higher voltage than the bulk), electrons may tunnel into the charge trapping structure 220. In some cases, the bulk node 245 may alternatively be referred to as a body node. Injection of electrons into the charge trapping structure 220 may be referred to as programming the memory cell 205 and may occur as part of a program operation. A programmed memory cell may, in some cases, be considered as storing a logic 0. When a second voltage is applied to the control node 240 (e.g., via the word line 265) relative to the bulk node 245 for the transistor 210 (e.g., when the control node 240 is at a lower voltage than the bulk node 245), electrons may leave the charge trapping structure 220. Removal of electrons from the charge trapping structure 220 may be referred to as erasing the memory cell 205 and may occur as part of an erase operation. An erased memory cell may, in some cases, be considered as storing a logic 1. In some cases, memory cells 205 may be programmed at a page-level of granularity due to memory cells 205 of a page sharing a common word line 265, and memory cells 205 may be erased at a block level of granularity due to memory cells 205 of a block sharing commonly biased bulk nodes 245.

In contrast to writing an SLC memory cell 205, writing a multiple-level (e.g., MLC, TLC, or QLC) memory cell 205 may involve applying different voltages to the memory cell 205 (e.g., to the control node 240 or bulk node 245 thereof) at a finer level of granularity to more finely control the amount of charge stored on the charge trapping structure 220, thereby enabling a larger set of logic values to be represented. Thus, multiple-level memory cells 205 may provide greater density of storage relative to SLC memory cells 205 but may, in some cases, involve narrower read or write margins or greater complexities for supporting circuitry.

A charge-trapping NAND memory cell 205 may operate similarly to a floating-gate NAND memory cell 205 but, instead of or in addition to storing a charge on a charge trapping structure 220, a charge-trapping NAND memory cell 205 may store a charge representing a logic state in a dielectric material below the control gate 215. Thus, a charge-trapping NAND memory cell 205 may or may not include a charge trapping structure 220.

In some examples, each row of memory cells 205 may be connected to a corresponding word line 265, and each column of memory cells 205 may be connected to a corresponding digit line 255. Thus, one memory cell 205 may be located at the intersection of a word line 265 and a digit line 255. This intersection may be referred to as an address of a memory cell 205. Digit lines 255 may alternatively be referred to as bit lines. In some cases, word lines 265 and digit lines 255 may be substantially perpendicular to one another and may create an array of memory cells 205. In some cases, word lines 265 and digit lines 255 may be generically referred to as access lines or select lines.

In some cases, memory device 200 may include a three-dimensional (3D) memory array, where multiple two-dimensional (2D) memory arrays may be formed on top of one another. This may increase the quantity of memory cells 205 that may be placed or fabricated on a single die or substrate as compared with 2D arrays, which, in turn, may reduce production costs, or increase the performance of the memory array, or both. In the example of FIG. 2, memory device 200 includes multiple levels (e.g., decks) of memory cell 205. The levels may, in some examples, be separated by an electrically insulating material. Each level may be aligned or positioned so that memory cells 205 may be aligned (e.g., exactly aligned, overlapping, or approximately aligned) with one another across each level, forming a memory cell stack 275. In some cases, a memory cell stack 275 may be referred to as a string of memory cells 205.

Accessing memory cells 205 may be controlled through a row decoder 260 and a column decoder 250. For example, a row decoder 260 may receive a row address from a memory controller 280 and activate an appropriate word line 265 based on the received row address. Similarly, a column decoder 250 may receive a column address from a memory controller 280 and activate an appropriate digit line 255. Thus, by activating one word line 265 and one digit line 255, one memory cell 205 may be accessed. In various examples, a memory controller 280 may be a portion of a local memory controller 165, or a device memory controller 155, or a combination thereof.

Upon accessing, a memory cell 205 may be read, or sensed, by a sense component 270. For example, a sense component 270 may be configured to determine the stored logic value of a memory cell 205 based on a signal generated by accessing the memory cell 205. The signal may include a current, a voltage, or both a current and a voltage on the digit line 255 for the memory cell 205 and may depend on the logic value stored by the memory cell 205. The sense component 270 may include various transistors or amplifiers configured to detect and amplify a signal (e.g., a current or voltage) on a digit line 255. The logic value of a memory cell 205 as detected by the sense component 270 may be output via an input/output component 285. In some examples, a sense component 270 may be a part of a column decoder 250 or a row decoder 260, or a sense component 270 may otherwise be connected to or in electronic communication with a column decoder 250 or a row decoder 260. In some examples, a column decoder 250, a row decoder 260, or a sense component, or any combination thereof may be included in a local memory controller 165. In some examples, an input/output component 285, or a driver thereof, may be configured to be coupled with an interface (e.g., an interface 115, an SPI), and such an output may not be terminated or may otherwise be a high impedance output.

A memory cell 205 may be programmed or written by activating the relevant word line 265 and digit line 255 to enable a logic value (e.g., representing one or more bits of information) to be stored in the memory cell 205. A column decoder 250 or a row decoder 260 may accept data, for example from input/output component 285, to be written to the memory cells 205. In the case of NAND memory, such as flash memory used in some NAND and 3D NAND memory devices, a memory cell 205 may be written by storing electrons in a charge trapping structure or an insulating layer.

A memory controller 280 may control the operation (e.g., read, write, re-write, refresh) of memory cells 205 through the various components, for example, row decoder 260, column decoder 250, and sense component 270. In some cases, one or more of row decoder 260, column decoder 250, and sense component 270 may be co-located with memory controller 280. A memory controller 280 may generate row and column address signals in order to activate the desired word line 265 and digit line 255. In some examples, a memory controller 280 may generate and control various voltages or currents used during the operation of memory device 200.

Figure 3A:
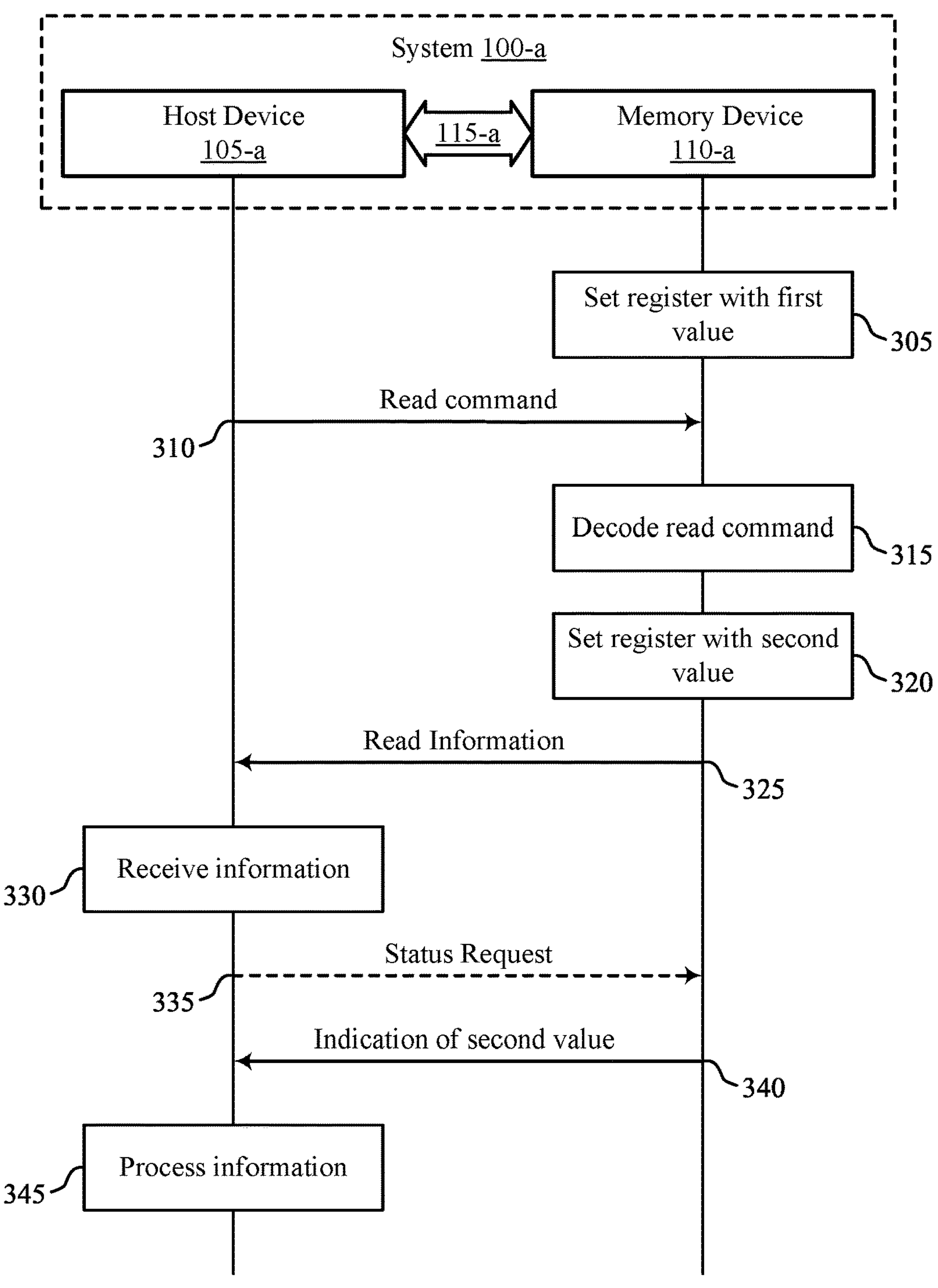
FIGS. 3A and 3B illustrate examples of process flows and related signaling that support read command fault detection in a memory system in accordance with examples as disclosed herein.
Figure 3B:
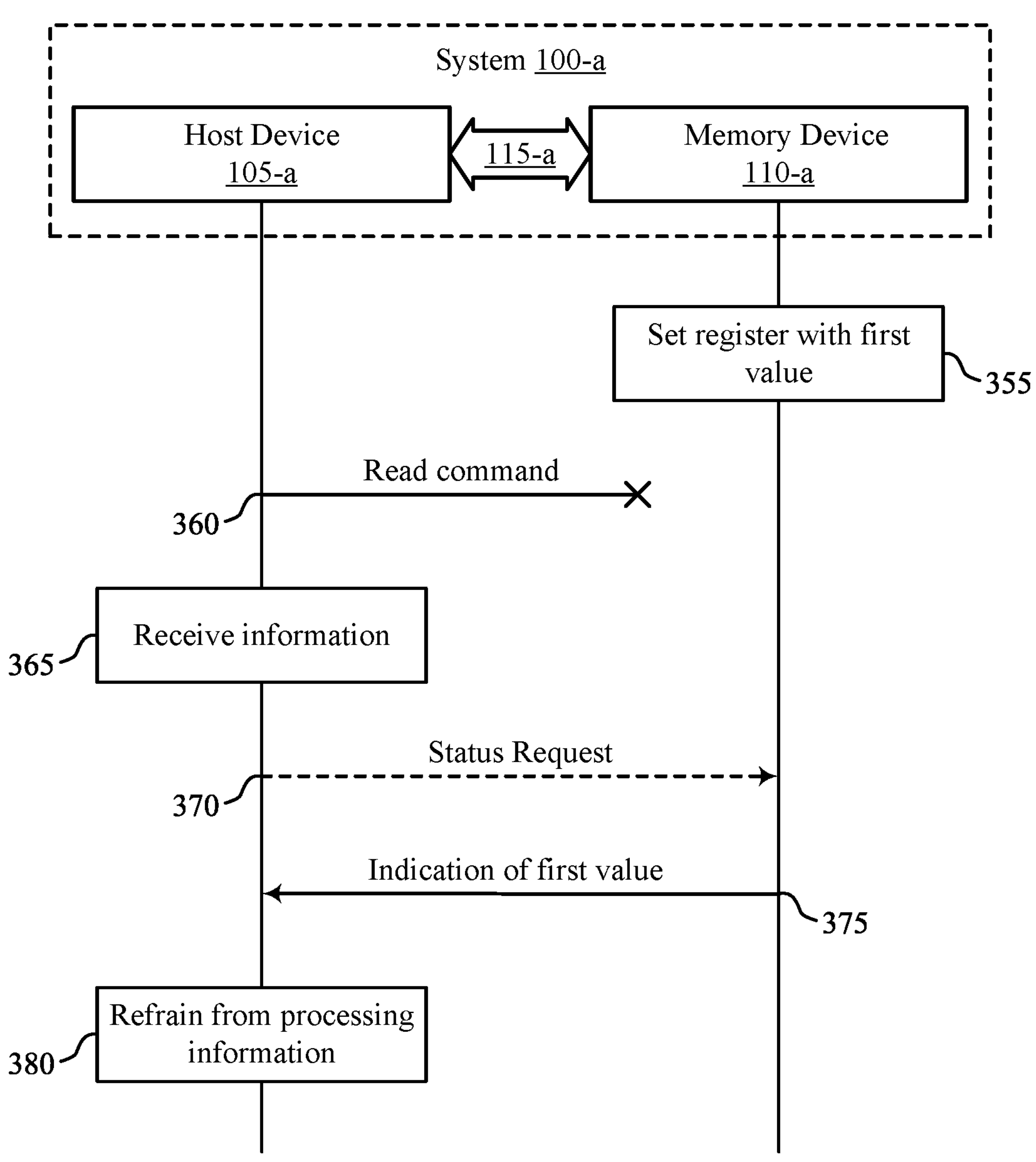

FIGS. 3A and 3B illustrate examples of process flows 300 and 350, respectively, and related signaling that support read command fault detection in a memory system in accordance with examples as disclosed herein. Operations of the process flows 300 and 350 may be performed by one or more components of a host device 105-*a* (e.g., an external memory controller 120 of the host device 105-*a*) and a memory device 110-*a* (e.g., a device memory controller 155, a memory controller 280, an input/output component 285, or a combination thereof of the memory device 110-*a*) of a system 100-*a*, which may be examples of the respective components described with reference to FIGS. 1 and 2. In various examples, the memory device 110-*a* may be configured as a standalone NAND device, or a managed NAND device, among other logical configurations or memory architecture configurations.

In some examples, signaling between the host device 105-*a* and the memory device 110-*a* may be conveyed via an interface 115-*a*, which may be implemented as a full duplex interface or a synchronous serial communication interface, such as an SPI, among other architectures. A data bus of the interface 115-*a* may be associated with a quantity of signals paths (e.g., four signal paths, four I/O paths) configured in a full duplex arrangement, which may support one or more channels or associated functionality thereof in accordance with various serialization or multiplexing techniques. In some examples, outputs of the host device 105-*a* or of the memory device 110-*a* that are coupled with the interface 115-*a* may not be terminated, or may otherwise implement a configuration in which a signal path of the interface 115-*a* may not have a determinate level (e.g., voltage) when the signal path is not being actively driven.

In some examples, the interface 115 may not be used (e.g., by a transmitting device) to convey parity bits or other error correction information, which may be associated with a receiving device assuming that information read from the interface 115 is valid. In some such examples, error correction functionality may be handled by the memory device 110-*a*, which may include the memory device 110-*a* performing a generation and storage of parity bits, a validation of read information in response to a read command, a signaling of an ECC status (e.g., to the host device 105-*a*), among other functionality. In some examples, the system 100-*a* may be configured to perform operations in accordance with a minimum page size.

The process flows 300 and 350 illustrate examples of how the system 100-*a* may implement logical signaling to indicate whether the memory device 110-*a* has decoded a read command transmitted by the host device 105-*a*. For example, the memory device 110-*a* may transmit an indication of a value of a field of a register to the host device 105-*a*, which the host device 105-*a* may use to evaluate whether to process information interpreted over the interface 115-*a*. Such techniques may prevent the host device 105-*a* from erroneously processing information interpreted from the interface 115-*a*.

The process flow 300 illustrates an example of operations and signaling in a scenario where the memory device 110-*a* receives and decodes a read command from the host device 105-*a*, and accordingly signals both read information and an indication to the host device 105-*a* that the memory device 110-*a* has decoded the read command.

At 305, the process flow 300 may include the memory device 110-*a* setting a register with a first value. The first value may correspond to a state or condition in which the memory device 110-*a* has not decoded a read command In some examples, the first value may correspond to an initial value or a default value for operations of the process flow 300, which may correspond to a state after a prior access operation was performed successfully, or some other time-initiated or condition-initiated default state. Accordingly, the memory device 110-*a* may be configured to set the register with the first value to operate in a condition for which the memory device 110-*a* may expect to receive a read command, or other command, or to be otherwise available to receive a command or other signaling for potential decoding.

In some examples, the system 100-*a* may implement a register associated with an ECC functionality of the memory device 110-*a*, such as an ECC status register, which may be used to report an ECC result after a read command (e.g., to indicate an error condition of the memory device 110-*a*). In the example of system 100-*a*, such a register may be leveraged to additionally provide the described indication of whether the memory device 110-*a* has decoded a read command Table 1 illustrates an example of such a register, where various values of a 3-bit field may be used to indicate an error condition of the memory device 110-*a* as well as a decoding condition.

TABLE 1

ECC Status Register Bit Descriptions

| Bit 2 | Bit 1 | Bit 0 | Description |
|---|---|---|---|
| 0 | 0 | 0 | No errors |
| 0 | 0 | 1 | 1-3 bit errors detected and corrected |
| 0 | 1 | 0 | Bit errors greater than 8 bits detected and not corrected |
| 0 | 1 | 1 | 3-6 bit errors detected and corrected (refresh may be performed) |
| 1 | 0 | 1 | 7-8 bit errors detected and corrected (refresh must be performed) |
| 1 | 1 | 1 | Read command not decoded |
| | Others | | Reserved |

As illustrated the example of Table 1, the memory device 110-*a* may be configured to set the field of the ECC status register to a value of 000 if no errors are detected based on performing a read operation, and may be configured to set the field of the ECC status register to a value of 001, 010, 011, or 101 if at least one error is detected based on performing a read operation (e.g., where a Bit 0 may be used as a gross error indicator). In some examples, certain values of the field of the ECC status register may be further associated with an indication of whether errors have been corrected, or whether a refresh may be performed (e.g., should be performed) or must be performed, among other indications. In the example of system 100-*a*, the memory device 110-*a* may implement the field of the ECC status register for further functionality related to the described techniques for signaling a decoding status. For example, at 305, the memory device 110-*a* may set the field of the register to a value of 111, which may be associated with a state or condition where a read command has not been decoded.

At 310, the process flow 300 may include the host device 105-*a* transmitting a read command (e.g., over the interface 115-*a*). For example, the read command of 310 may be associated with a request for information from the memory device 110-*a*, and may include an address or memory cells 205 that are storing the requested information. In the example of process flow 300, the read command of 310 may be received by the memory device 110-*a*.

At 315, the process flow 300 may include the memory device 110-*a* decoding the received read command (e.g., successfully decoding the read command) In a response to the successful decoding of the read command at 315, the memory device 110-*a* may perform a read operation based on accessing one or more memory cells 205 of a memory array (e.g., a memory array 170).

At 320, the process flow 300 may include the memory device 110-*a* setting the register with a second value (e.g., a different value than set at 305, based on decoding the read command at 315). For example, in the context of the ECC status register of Table 1, at 320, the memory device 110-*a* may set the field of the register to a value of 000 if no errors are detected during the read operation, or may set the field of the register to a value of 001 if one to three bit errors were detected and corrected as part of the read operation, and so on. By setting the register with a different value, the memory device 110-*a* may store an indication that the read command of 310 was successfully received and decoded.

At 325, the process flow 300 may include the memory device 110-*a* transmitting read information (e.g., logic states associated with memory cells 205 accessed in response to the read command of 310) to the host device 105-*a*. For example, at 325, the memory device 110-*a* may drive one or more output terminals (e.g., of an input/output component 285, of a device memory controller 155) that are coupled with the interface 115-*a* (e.g., a data bus of the interface 115-*a*) to convey the read information to the host device 105-*a*. Accordingly, one or more signal paths of the interface 115-*a* may be driven to a determinate level (e.g., voltage) by the memory device 110-*a*.

At 330, the process flow 300 may include the host device 105-*a* receiving information via the interface 115-*a*. For example, the host device 105-*a* may latch (e.g., at an external memory controller 120) one or more signals each associated with a respective signal path of the interface 115-*a*. In the example of process flow 300, because the memory device 110-*a* performs the transmission of read information at 325 (e.g., driving the one or more signal paths of the interface 115-*a* to a determinate level), the receiving of information at 330 may be associated with reading the read information as transmitted by the memory device 110-*a* at 325.

In some examples, at 335, the process flow 300 may include the host device 105-*a* transmitting a status request (e.g., a request for an indication of whether the memory device 110-*a* decoded the read command of 310, or identified an error while processing a read operation, among other indications). In some examples, the operations of 335 may be omitted, such as when the memory device 110-*a* is configured to transmit status information without receiving a separate request from the host device 105-*a* (e.g., in configurations or circumstances for which the memory device 110-*a* transmits status information based on another trigger, such as receiving the read command of 310 or a clock signal, among other examples).

At 340, the process flow 300 may include the memory device 110-*a* transmitting an indication of the value of the register, which may be received by the host device 105-*a*. In the example of process flow 300, because the memory device 110-*a* successfully decoded the read command of 310 (e.g., at 315), and set the register with a second value at 320, the indication of 340 may include an indication of the second value.

At 345, the process flow 300 may include the host device processing the information received at 330 (e.g., based on receiving the indication of the second value at 340). For example, because the indication of 340 may be associated with the memory device 110-*a* having successfully decoded a read command (e.g., the read command of 310), the host device 105-*a* may assume that, at 330, the memory device was driving the interface 115-*a* in accordance with read information responsive to the read command of 310, and that the received information of 330 is valid read information. In some examples, the host device 105-*a* may perform other operations responsive to the indication of the register value, such as evaluating whether to command a refresh operation of the memory device 110-*a* (e.g., in response to a value of 011 or 101) or attempt to re-read the memory device 110-*a* or perform other error handling (e.g., in response to a value of 010, indicating that read errors were not corrected).

After the operations of the process flow 300, or at least after the operations of 340, the memory device 110-*a* may reset the register with the first value (e.g., performing the operations of 305), which may reinitialize or reset the register with a value corresponding to having not decoded a read command (e.g., a subsequent read command). Accordingly, the memory device 110-*a* may return to operating in a condition that supports receiving and attempting to decode another read command, and operating the described register accordingly.

The process flow 350 illustrates an example of operations and signaling in a scenario where the memory device 110-*a* does not decode a read command from the host device 105-*a*, and accordingly signals an indication to the host device 105-*a* that the memory device 110-*a* has not decoded a read command.

At 355, the process flow 350 may include the memory device 110-*a* setting a register with a first value. The first value may correspond to a state or condition in which the memory device 110-*a* has not decoded a read command. For example, at 355, the memory device 110-*a* may set the field of the register to a value of 111, which may be associated with a state or condition where a read command has not been decoded.

At 360, the process flow 350 may include the host device 105-*a* transmitting a read command (e.g., over the interface 115-*a*). For example, the read command of 360 may be associated with a request for information from the memory device 110-*a*, and may include an address or memory cells 205 that are storing the requested information. In the example of process flow 350, however, the read command of 360 may not be received, decoded, or otherwise recognized by the memory device 110-*a*. For example, the read command itself may not have been successfully conveyed over the interface 115-*a*, or the signaling of the read command of 360 may be associated with a control signal fault or a clock signal fault, or a decoder of the memory device 110-*a* may have experienced a fault, among other faults. Accordingly, in the process flow 350, the memory device 110-*a* may not set the register with a second (e.g., different) value, because the memory device 110-*a* may not recognize that the host device 105-*a* was trying to access it.

At 365, the process flow 350 may include the host device 105-*a* receiving information via the interface 115-*a*. For example, the host device 105-*a* may latch (e.g., at an external memory controller 120) one or more signals each associated with a respective signal path of the interface 115-*a*. In the example of process flow 350, however, the memory device 110-*a* may not be performing a transmission of read information (e.g., as a result of not having decoded a read command), such that one or more signal paths of the interface 115-*a* may not be driven to a determinate level. Accordingly, the information received at 365 may be invalid.

In some examples, at 370, the process flow 350 may include the host device 105-*a* transmitting a status request (e.g., a request for an indication of whether the memory device 110-*a* decoded the read command of 360, or identified an error while processing a read operation, among other indications). In some examples, the operations of 370 may be omitted, such as when the memory device 110-*a* is configured to transmit status information without receiving a separate request from the host device 105-*a* (e.g., in configurations or circumstances for which the memory device 110-*a* transmits status information based on another trigger).

At 375, the process flow 350 may include the memory device 110-*a* transmitting an indication of the value of the register, which may be received by the host device 105-*a*. In the example of process flow 300, because the memory device 110-*a* did not decode the read command of 360, and did not set the register with a second value, the indication of 375 may include an indication of the first value.

At 380, the process flow 350 may include the host device refraining from processing the information received at 365 (e.g., based on receiving the indication of the first value at 375). For example, because the indication of 375 may be associated with the memory device 110-*a* having not decoded a read command (e.g., the read command of 360), the host device 105-*a* may assume that, at 365, the memory device was not driving the interface 115-*a* in response to the read command of 360, and that the received information of 365 is not valid read information. In an implementation of the ECC status register of Table 1, for example, a value of Bit 0 being equal to 1 may be interpreted as indicating an error, while the full value (e.g., 111) may further clarify that the "data" received at 365 is from an "invalid read." In some examples, the host device 105-*a* may perform other operations responsive to the indication of the register value, such as attempting to re-read the memory device 110-*a* or performing other error handling.

Figure 4:
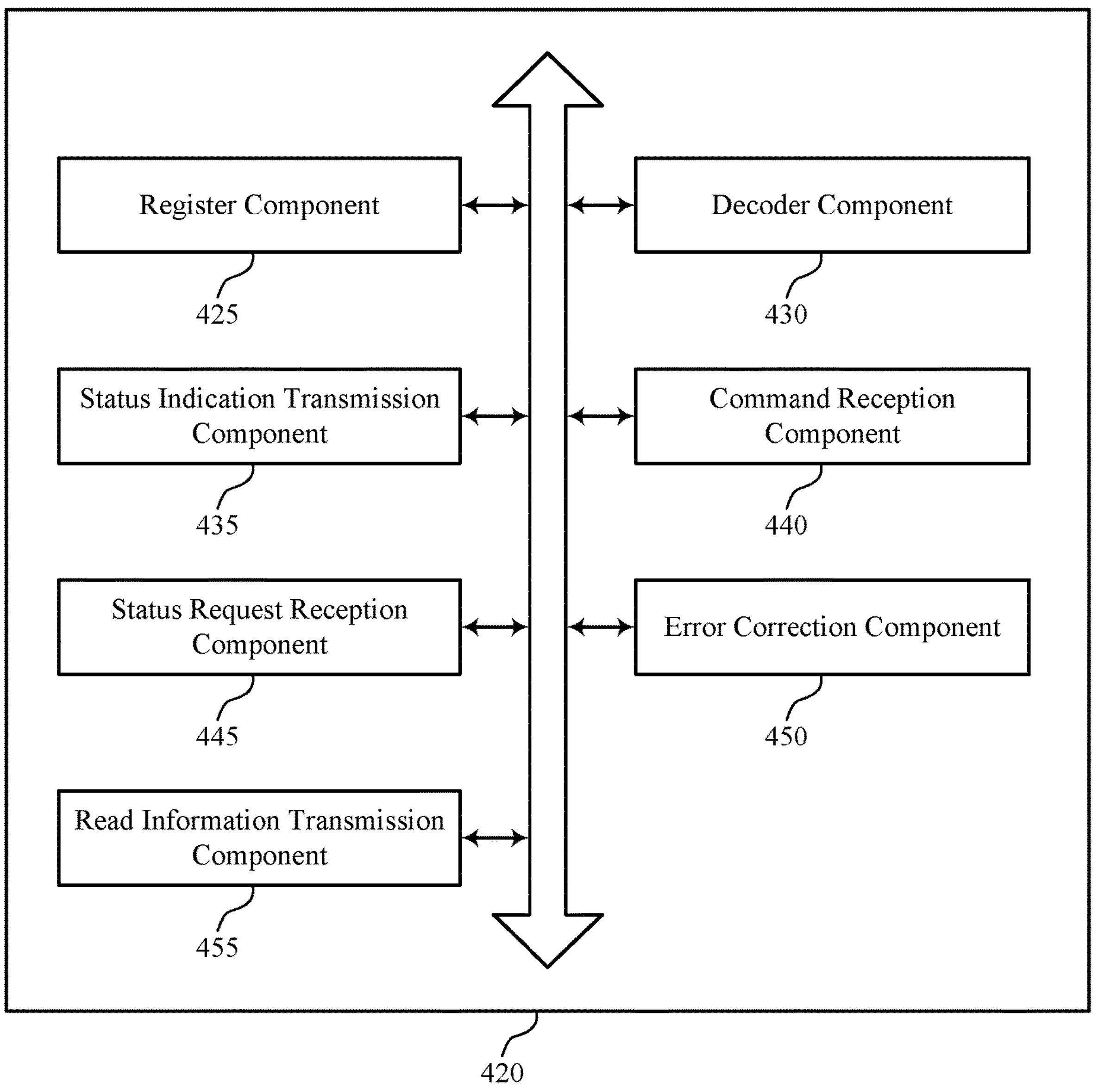
FIG. 4 shows a block diagram of a memory device that supports read command fault detection in a memory system in accordance with examples as disclosed herein.

FIG. 4 shows a block diagram 400 of a memory device 420 that supports read command fault detection in a memory system in accordance with examples as disclosed herein. The memory device 420 may be an example of aspects of a memory device as described with reference to FIGS. 1 through 3. The memory device 420, or various components thereof, may be an example of means for performing various aspects of read command fault detection in a memory system as described herein. For example, the memory device 420 may include a register component 425, a decoder component 430, a status indication transmission component 435, a command reception component 440, a status request reception component 445, an error correction component 450, a read information transmission component 455, or any combination thereof. Each of these components may communicate, directly or indirectly, with one another (e.g., via one or more buses).

The register component 425 may be configured as or otherwise support a means for setting a field of a register with a first value. The decoder component 430, or the register component 425, or both may be configured as or otherwise support a means for determining whether to set the field of the register with a second value based at least in part on whether the memory device 420 (e.g., the decoder component 430) has decoded a read command from a host device. The status indication transmission component 435 may be configured as or otherwise support a means for transmitting an indication of a value of the field of the register based at least in part on a signal from the host device, where the indication of the value of the field of the register may be based at least in part on whether the memory device 420 (e.g., the decoder component 430) has decoded the read command from the host device.

In some examples, the command reception component 440 may be configured as or otherwise support a means for receiving the read command from the host device. In some examples, the decoder component 430, or the register component 425, or both may be configured as or otherwise support a means for determining to set the field of the register with the second value based at least in part on the memory device 420 (e.g., the decoder component 430) decoding the received read command from the host device, where transmitting the indication of the value of the field of the register may include transmitting an indication of the second value.

In some examples, the read information transmission component 455 may be configured as or otherwise support a means for transmitting information associated with the read command to the host device based at least in part on the memory device 420 (e.g., the decoder component 430) decoding the read command In some examples, the status request reception component 445 may be configured as or otherwise support a means for receiving a status request from the host device based at least in part on the read information transmission component 455 transmitting the information associated with the read command. In some examples, the signal may include the status request. In some examples, the signal may include the read command (e.g., where the indication of the value of the field of the register may be transmitted without receiving or otherwise being responsive to a request).

In some examples, the register component 425 may be configured as or otherwise support a means for setting (e.g., resetting) the field of the register with the first value after transmitting the indication of the value of the field of the register.

In some examples, the status request reception component 445 may be configured as or otherwise support a means for receiving a request from the host device, and the status indication transmission component 435 transmitting the indication of the value of the field of the register may include transmitting an indication of the first value based at least in part on the memory device 420 (e.g., the decoder component 430) not decoding a read command from the host device.

In some examples, the register may be associated with an error correction code functionality of the memory device (e.g., a functionality of the error correction component 450). In some examples, to support determining whether to set the field of the register with the second value, the error correction component 450 may be configured as or otherwise support a means for determining (e.g., using the error correction code functionality) a bit error status of information associated with a decoded read command In some examples, to support determining whether to set the field of the register with the second value, the decoder component 430, or the register component 425, or both may be configured as or otherwise support a means for setting the field of the register in accordance with the determined bit error status of the information.

Figure 5:
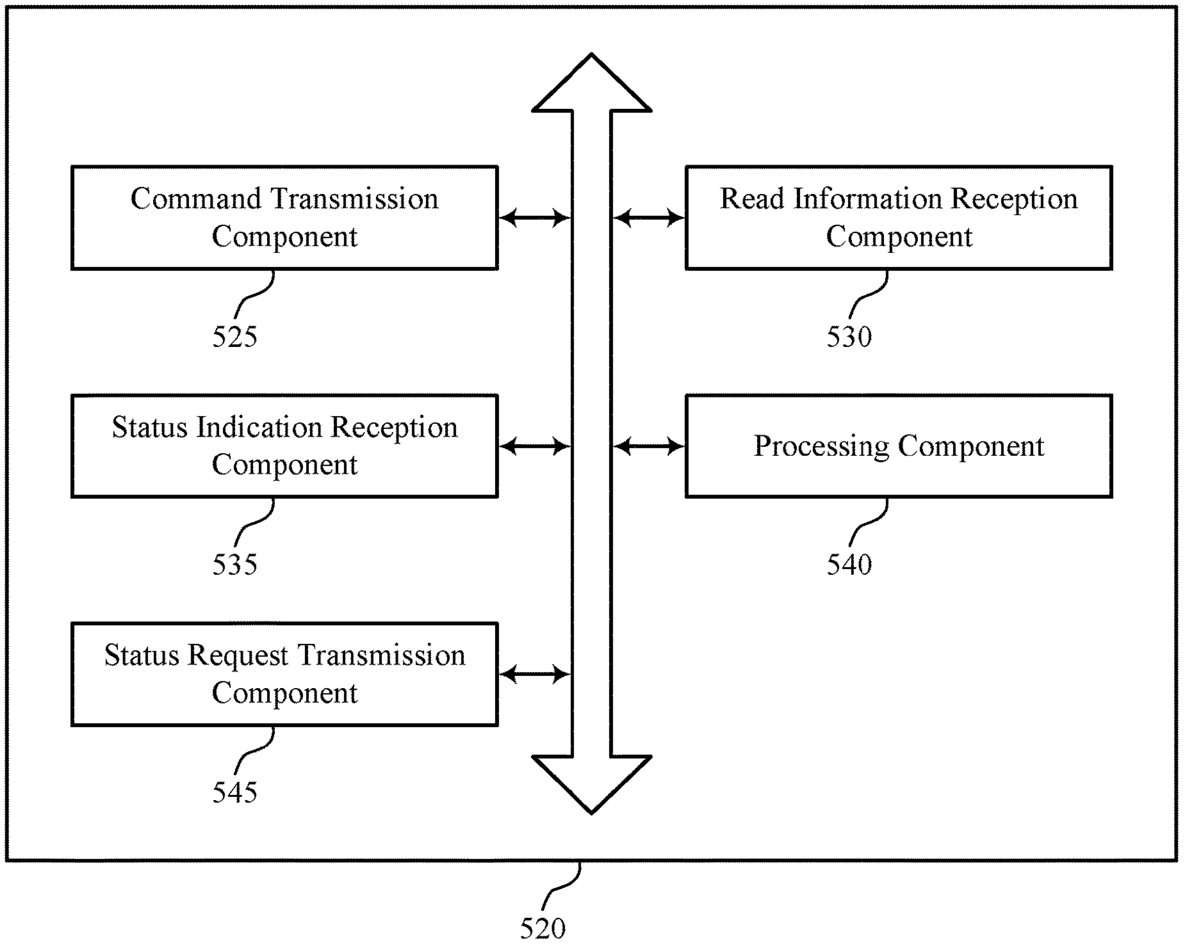
FIG. 5 shows a block diagram of a host device that supports read command fault detection in a memory system in accordance with examples as disclosed herein.

FIG. 5 shows a block diagram 500 of a host device 520 that supports read command fault detection in a memory system in accordance with examples as disclosed herein. The host device 520 may be an example of aspects of a host device as described with reference to FIGS. 1 through 3. The host device 520, or various components thereof, may be an example of means for performing various aspects of read command fault detection in a memory system as described herein. For example, the host device 520 may include a command transmission component 525, a read information reception component 530, a status indication reception component 535, a processing component 540, a status request transmission component 545, or any combination thereof. Each of these components may communicate, directly or indirectly, with one another (e.g., via one or more buses).

The command transmission component 525 may be configured as or otherwise support a means for transmitting a read command to a memory device. The read information reception component 530 may be configured as or otherwise support a means for receiving information based at least in part on transmitting the read command to the memory device. The status indication reception component 535 may be configured as or otherwise support a means for receiving an indication of a value of a field of a register of the memory device (e.g., based at least in part on transmitting the read command to the memory device). The processing component 540 may be configured as or otherwise support a means for determining whether to process the information based at least in part on the indicated value of the field of the register.

In some examples, to support determining whether to process the information, the processing component 540 may be configured as or otherwise support a means for determining to not process the information based at least in part on the indicated value corresponding to the memory device having not decoded the read command.

In some examples, to support determining whether to process the information, the processing component 540 may be configured as or otherwise support a means for determining to process the information based at least in part on the indicated value corresponding to the memory device having decoded the read command.

In some examples, the register may be associated with an error correction code functionality of the memory device. In some examples, the indicated value may correspond to a bit error status of the information.

In some examples, the status request transmission component 545 may be configured as or otherwise support a means for transmitting a request to the memory device, and receiving the indication of the value of the field of the register may be based at least in part on transmitting the request.

Figure 6:
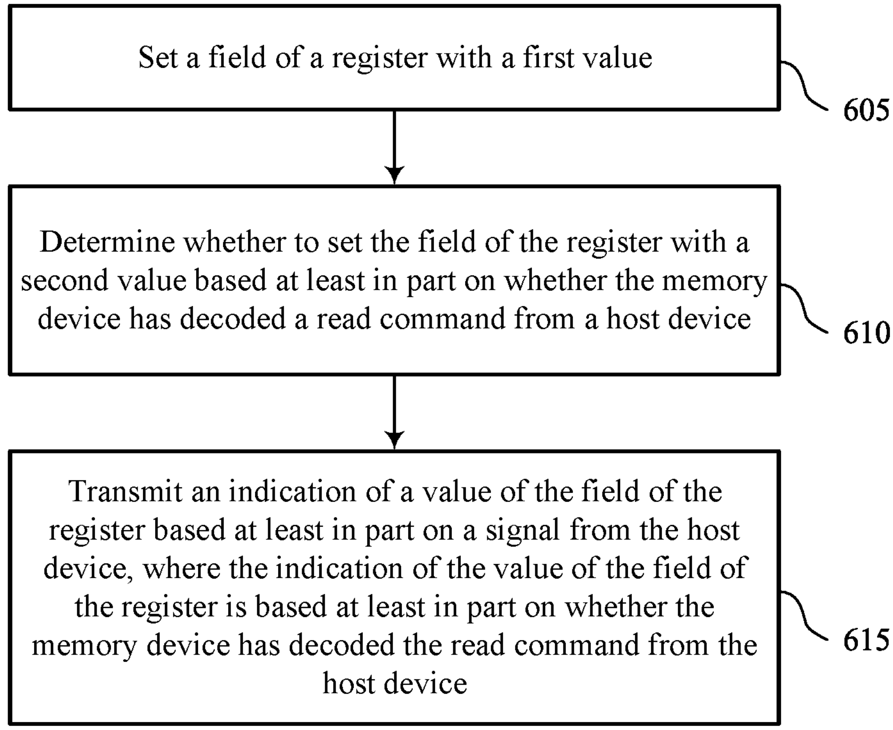
FIGS. 6 and 7 show flowcharts illustrating a method or methods that support read command fault detection in a memory system in accordance with examples as disclosed herein.

FIG. 6 shows a flowchart illustrating a method 600 that supports read command fault detection in a memory system in accordance with examples as disclosed herein. The operations of method 600 may be implemented by a memory device or its components as described herein. For example, the operations of method 600 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 605, the method may include setting a field of a register with a first value. The operations of 605 may be performed in accordance with examples as disclosed herein. In some examples, aspects of the operations of 605 may be performed by a register component 425 as described with reference to FIG. 4.

At 610, the method may include determining whether to set the field of the register with a second value based at least in part on whether the memory device has decoded a read command from a host device. The operations of 610 may be performed in accordance with examples as disclosed herein. In some examples, aspects of the operations of 610 may be performed by a decoder component 430, or the register component 425, or both as described with reference to FIG. 4.

At 615, the method may include transmitting an indication of a value of the field of the register based at least in part on a signal from the host device, where the indication of the value of the field of the register is based at least in part on whether the memory device has decoded the read command from the host device. The operations of 615 may be performed in accordance with examples as disclosed herein. In some examples, aspects of the operations of 615 may be performed by a status indication transmission component 435 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for setting (e.g., by a memory device) a field of a register with a first value; determining (e.g., by the memory device) whether to set the field of the register with a second value based at least in part on whether the memory device has decoded a read command from a host device; and transmitting (e.g., by the memory device) an indication of a value of the field of the register based at least in part on a signal from the host device, where the indication of the value of the field of the register is based at least in part on whether the memory device has decoded the read command from the host device.

Aspect 2: The method, apparatus, or non-transitory computer-readable medium of aspect 1, further including operations, features, circuitry, logic, means, or instructions, or any combination thereof for receiving (e.g., at the memory device) the read command from the host device and determining (e.g., by the memory device) to set the field of the register with the second value based at least in part on decoding the received read command from the host device, where transmitting the indication of the value of the field of the register includes transmitting an indication of the second value.

Aspect 3: The method, apparatus, or non-transitory computer-readable medium of aspect 2, further including operations, features, circuitry, logic, means, or instructions, or any combination thereof for transmitting (e.g., by the memory device) information associated with the read command to the host device based at least in part on decoding the read command and receiving (e.g., at the memory device) a status request from the host device based at least in part on transmitting the information associated with the read command, where the signal includes the status request.

Aspect 4: The method, apparatus, or non-transitory computer-readable medium of aspect 2, where the signal includes the read command.

Aspect 5: The method, apparatus, or non-transitory computer-readable medium of any of aspects 2 through 4, further including operations, features, circuitry, logic, means, or instructions, or any combination thereof for setting (e.g., by the memory device) the field of the register with the first value after transmitting the indication of the value of the field of the register.

Aspect 6: The method, apparatus, or non-transitory computer-readable medium of aspect 1, further including operations, features, circuitry, logic, means, or instructions, or any combination thereof for receiving (e.g., at the memory device) a request from the host device, where transmitting the indication of the value of the field of the register includes transmitting an indication of the first value based at least in part on not decoding the read command from the host device.

Aspect 7: The method, apparatus, or non-transitory computer-readable medium of any of aspects 1 through 6, where determining whether to set the field of the register with the second value includes operations, features, circuitry, logic, means, or instructions, or any combination thereof for determining, using the error correction code functionality, a bit error status of information associated with a decoded read command and setting the field of the register in accordance with the determined bit error status of the information.

Figure 7:
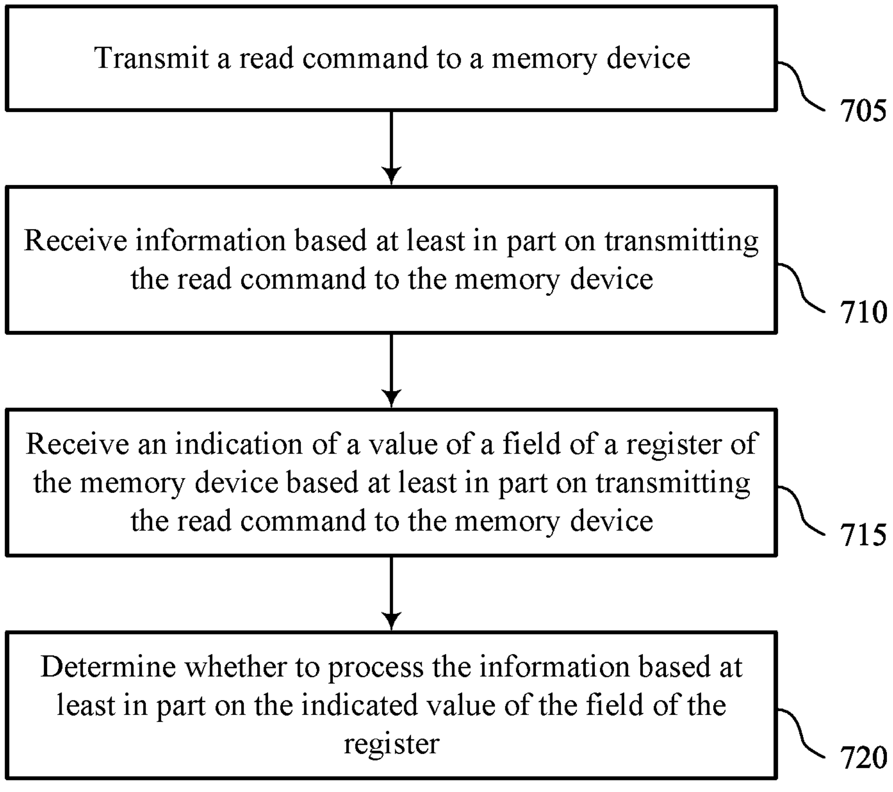

FIG. 7 shows a flowchart illustrating a method 700 that supports read command fault detection in a memory system in accordance with examples as disclosed herein. The operations of method 700 may be implemented by a host device or its components as described herein. For example, the operations of method 700 may be performed by a host device as described with reference to FIGS. 1 through 3 and 5. In some examples, a host device may execute a set of instructions to control the functional elements of the device to perform the described functions. Additionally or alternatively, the host device may perform aspects of the described functions using special-purpose hardware.

At 705, the method may include transmitting a read command to a memory device. The operations of 705 may be performed in accordance with examples as disclosed herein. In some examples, aspects of the operations of 705 may be performed by a command transmission component 525 as described with reference to FIG. 5.

At 710, the method may include receiving information based at least in part on transmitting the read command to the memory device. The operations of 710 may be performed in accordance with examples as disclosed herein. In some examples, aspects of the operations of 710 may be performed by a read information reception component 530 as described with reference to FIG. 5.

At 715, the method may include receiving an indication of a value of a field of a register of the memory device based at least in part on transmitting the read command to the memory device. The operations of 715 may be performed in accordance with examples as disclosed herein. In some examples, aspects of the operations of 715 may be performed by a status indication reception component 535 as described with reference to FIG. 5.

At 720, the method may include determining whether to process the information based at least in part on the indicated value of the field of the register. The operations of 720 may be performed in accordance with examples as disclosed herein. In some examples, aspects of the operations of 720 may be performed by a processing component 540 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 8: A method, apparatus, or non-transitory computer-readable medium including operations, features, circuitry, logic, means, or instructions, or any combination thereof for transmitting (e.g., by a host device) a read command to a memory device; receiving information (e.g., at the host device) based at least in part on transmitting the read command to the memory device; receiving an indication of a value of a field of a register of the memory device based at least in part on transmitting the read command to the memory device; and determining whether to process the information based at least in part on the indicated value of the field of the register.

Aspect 9: The method, apparatus, or non-transitory computer-readable medium of aspect 8, where the determining includes operations, features, circuitry, logic, means, or instructions, or any combination thereof for determining to not process the information based at least in part on the indicated value corresponding to the memory device having not decoded the read command.

Aspect 10: The method, apparatus, or non-transitory computer-readable medium of aspect 8, where the determining includes operations, features, circuitry, logic, means, or instructions, or any combination thereof for determining to process the information based at least in part on the indicated value corresponding to the memory device having decoded the read command.

Aspect 11: The method, apparatus, or non-transitory computer-readable medium of aspect 10, where the register is associated with an error correction code functionality of the memory device and the indicated value corresponds to a bit error status of the information.

Aspect 12: The method, apparatus, or non-transitory computer-readable medium of any of aspects 8 through 11, further including operations, features, circuitry, logic, means, or instructions, or any combination thereof for transmitting (e.g., by the host device) a request to the memory device, where receiving the indication of the value of the field of the register is based at least in part on transmitting the request.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a memory array; an interface operable for coupling with a host device; and a controller coupled with the memory array and the interface, the controller operable to cause the apparatus to: set a field of a register with a first value; determine whether to set the field of the register with a second value based at least in part on whether the controller has decoded a read command from the host device; and transmit, using the interface, an indication of a value of the field of the register based at least in part on a signal from the host device, where the indication of the value of the field of the register is based at least in part on whether the controller has decoded the read command from the host device.

Aspect 14: The apparatus of aspect 13, where the controller is operable to cause the apparatus to: receive the read command from the host device; and determine to set the field of the register with the second value based at least in part on decoding the received read command from the host device, where transmitting the indication of the value of the field of the register includes transmitting an indication of the second value.

Aspect 15: The apparatus of aspect 14, where the controller is operable to cause the apparatus to: transmit, using the interface, information associated with the read command to the host device based at least in part on decoding the read command; and receive, using the interface, a status request from the host device based at least in part on transmitting the information associated with the read command, where the signal includes the status request.

Aspect 16: The apparatus of any of aspects 14 through 15, where the controller is operable to cause the apparatus to: set the field of the register with the first value after transmitting the indication of the value of the field of the register.

Aspect 17: The apparatus of aspect 13, where the controller is operable to cause the apparatus to: receive, using the interface, a request from the host device, where transmitting the indication of the value of the field of the register includes transmitting an indication of the first value based at least in part on not decoding the read command from the host device.

Aspect 18: The apparatus of any of aspects 13 through 17, where the register is associated with an error correction code functionality of the controller, and where, to determine whether to set the field of the register with the second value, the controller is operable to cause the apparatus to: determine a bit error status of information associated with a decoded read command; and set the field of the register in accordance with the determined bit error status of the information.

Aspect 19: The apparatus of any of aspects 13 through 18, where the interface includes a serial peripheral interface.

An apparatus is described. The following provides an overview of aspects of the apparatus as described herein:

Aspect 20: A apparatus, including: an interface operable for coupling with a memory device; and a controller coupled with the interface and operable to cause the apparatus to: transmit, using the interface, a read command to the memory device; receive, using the interface, information based at least in part on transmitting the read command to the memory device; receive, using the interface, an indication of a value of a field of a register of the memory device based at least in part on transmitting the read command to the memory device; and determine whether to process the information based at least in part on the indicated value of the field of the register.

Aspect 21: The apparatus of aspect 20, where the controller is operable to cause the apparatus to: determine to not process the information based at least in part on the indicated value corresponding to the memory device having not decoded the read command.

Aspect 22: The apparatus of aspect 20, where the controller is operable to cause the apparatus to: determine to process the information based at least in part on the indicated value corresponding to the memory device having decoded the read command.

Aspect 23: The apparatus of aspect 22, where the register is associated with an error correction code functionality of the memory device, and the indicated value corresponds to a bit error status of the information.

Aspect 24: The apparatus of any of aspects 20 through 23, where the controller is operable to cause the apparatus to: transmit, using the interface, a request to the memory device, where receiving the indication of the value of the field of the register is based at least in part on transmitting the request.

Aspect 25: The apparatus of any of aspects 20 through 24, where the interface includes a serial peripheral interface.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

transmitting, from a host device, a read command to a memory device;

latching, at the host device, read information based at least in part on transmitting the read command to the memory device;

receiving, at the host device, an indication of a value of a field of a register of the memory device based at least in part on transmitting the read command to the memory device; and determining, at the host device, whether to process the latched read information or to refrain from processing the latched read information based at least in part on the indicated value of the field of the register.

2. The method of claim 1, wherein the determining comprises:

determining, at the host device based at least in part on the indicated value of the field of the register, whether to process the latched read information as valid data, or to refrain from processing the latched read information that may be invalid data.

3. The method of claim 1, wherein the determining comprises:

determining, at the host device, to not process the latched read information based at least in part on the indicated value of the field of the register corresponding to the memory device having not decoded the read command.

4. The method of claim 1, wherein the determining comprises:

determining, at the host device, to process the latched read information based at least in part on the indicated value of the field of the register corresponding to the memory device having decoded the read command.

5. The method of claim 4, wherein:

the register is associated with an error correction code functionality of the memory device, and the indicated value of the field of the register corresponds to a bit error status of the latched read information.

6. The method of claim 1, further comprising:

transmitting, from the host device, a request to the memory device, wherein receiving the indication of the value of the field of the register is based at least in part on transmitting the request.

7. The method of claim 1, further comprising:

commanding, by the host device, a refresh operation of the memory device based at least in part on the indicated value of the field of the register.

8. The method of claim 1, further comprising:

attempting to re-read the memory device based at least in part on the indicated value of the field of the register.

9. The method of claim 1, further comprising:

performing an error handling operation at the host device based at least in part on the indicated value of the field of the register.

10. A host device, comprising:

an interface operable for coupling with a memory device; and one or more processors coupled with the interface and operable to cause the host device to:

transmit, from the host device using the interface, a read command to the memory device;

latch, at the host device using the interface, read information based at least in part on transmitting the read command to the memory device;

receive, at the host device using the interface, an indication of a value of a field of a register of the memory device based at least in part on transmitting the read command to the memory device; and determine, at the host device, whether to process the latched read information or to refrain from processing the latched read information based at least in part on the indicated value of the field of the register.

11. The host device of claim 10, wherein the one or more processors are operable to cause the host device to:

determine, at the host device, to not process the latched read information based at least in part on the indicated value of the field of the register corresponding to the memory device having not decoded the read command.

12. The host device of claim 10, wherein the one or more processors are operable to cause the host device to:

determine, at the host device, to process the latched read information based at least in part on the indicated value of the field of the register corresponding to the memory device having decoded the read command.

13. The host device of claim 10, wherein:

the register is associated with an error correction code functionality of the memory device, and the indicated value of the field of the register corresponds to a bit error status of the latched read information.

14. The host device of claim 10, wherein the one or more processors are operable to cause the host device to:

transmit, from the host device using the interface, a request to the memory device, wherein receiving the indication of the value of the field of the register is based at least in part on transmitting the request.

15. The host device of claim 10, wherein the interface comprises a serial peripheral interface.

16. The host device of claim 10, wherein the one or more processors are operable to cause the host device to:

command a refresh operation of the memory device based at least in part on the indicated value of the field of the register.

17. The host device of claim 10, wherein the one or more processors are operable to cause the host device to:

attempt to re-read the memory device based at least in part on the indicated value of the field of the register.

18. The host device of claim 10, wherein the one or more processors are operable to cause the host device to:

perform an error handling operation at the host device based at least in part on the indicated value of the field of the register.

19. A non-transitory computer-readable medium storing code, the code comprising instructions executable by one or more processors to:

transmit, from a host device, a read command to a memory device;

latch, at the host device, read information based at least in part on transmitting the read command to the memory device;

receive, at the host device, an indication of a value of a field of a register of the memory device based at least in part on transmitting the read command to the memory device; and determine, at the host device, whether to process the latched read information or to refrain from processing the latched read information based at least in part on the indicated value of the field of the register.

20. The non-transitory computer-readable medium of claim 19, wherein the instructions are executable by the one or more processors to:

determine, at the host device, to not process the latched read information based at least in part on the indicated value of the field of the register corresponding to the memory device having not decoded the read command; and determine, at the host device, to process the latched read information based at least in part on the indicated value of the field of the register corresponding to the memory device having decoded the read command.

* * * * *